US009397209B2

(12) United States Patent
Yeh et al.

(10) Patent No.: US 9,397,209 B2
(45) Date of Patent: Jul. 19, 2016

(54) SEMICONDUCTOR STRUCTURE AND MANUFACTURING METHOD OF FORMING A LARGE PATTERN AND A PLURALITY OF FINE GATE LINES LOCATED BETWEEN THE LARGE PATTERNS

(71) Applicant: MACRONIX INTERNATIONAL CO., LTD., Hsin-Chu (TW)

(72) Inventors: Teng-Hao Yeh, Hsinchu (TW); Yen-Hao Shih, New Taipei (TW)

(73) Assignee: MACRONIX INTERNATIONAL CO., LTD., Hsin-Chu (TW)

( * ) Notice: Subject to any disclaimer, the term of this patent is extended or adjusted under 35 U.S.C. 154(b) by 310 days.

(21) Appl. No.: 13/657,026

(22) Filed: Oct. 22, 2012

(65) Prior Publication Data
US 2014/0110766 A1    Apr. 24, 2014

(51) Int. Cl.
H01L 29/78    (2006.01)
H01L 21/28    (2006.01)
H01L 21/033   (2006.01)
H01L 21/3213  (2006.01)
H01L 27/115   (2006.01)

(52) U.S. Cl.
CPC ............ *H01L 29/78* (2013.01); *H01L 21/0337* (2013.01); *H01L 21/28132* (2013.01); *H01L 21/32139* (2013.01); *H01L 27/11524* (2013.01)

(58) Field of Classification Search
CPC ....................................................... H01L 29/78
USPC ............ 257/288, E29.255, E21.409; 438/585
See application file for complete search history.

(56) References Cited

U.S. PATENT DOCUMENTS

| 6,818,480 B2 | 11/2004 | Lee et al. |
| 8,026,044 B2 | 9/2011 | Lee et al. |
| 8,198,157 B2 | 6/2012 | Sel et al. |
| 2002/0096705 A1* | 7/2002 | Choi ..................... H01L 27/115 257/315 |
| 2006/0292802 A1* | 12/2006 | Lee et al. ...................... 438/264 |
| 2009/0146322 A1 | 6/2009 | Weling et al. |
| 2012/0137261 A1 | 5/2012 | Ban et al. |

FOREIGN PATENT DOCUMENTS

JP    2004274062    9/2004

OTHER PUBLICATIONS

Taiwan Intellectual Property Office, "Office Action", Oct. 16, 2014.

* cited by examiner

*Primary Examiner* — Jerome Jackson, Jr.
*Assistant Examiner* — Lamont Koo
(74) *Attorney, Agent, or Firm* — WPAT, PC; Justin King; Douglas A. Hosack

(57) ABSTRACT

A semiconductor structure has a second portion with an appendage on one side of the second portion and extruding along the longitudinal direction of the second portion. Moreover the semiconductor structure also has a gate line longitudinally parallel to the second portion, wherein the length of the gate line equals to the longitudinal length of the second portion.

6 Claims, 6 Drawing Sheets

SEMICONDUCTOR STRUCTURE AND MANUFACTURING METHOD OF FORMING A LARGE PATTERN AND A PLURALITY OF FINE GATE LINES LOCATED BETWEEN THE LARGE PATTERNS

FIELD OF THE INVENTION

The present invention generally relates to a semiconductor structure, and more particularly, to a semiconductor memory structure.

BACKGROUND

In a semiconductor memory structure, there are typically two pattern features in the cell area. One feature is a large gate pattern which is usually rectangular. The large pattern can be configured as a ground select line (GSL) or a string select line (SSL). Another feature includes a plurality of fine gate lines arranged in an array manner. The fine gate lines are configured as word lines located between the large patterns.

The large patterns act as a switch to turn on/off the fine gate lines is array in between, while the distance between the large pattern and the gate lines is a critical dimension to fabricate the memory structure. Typically, the characterization of the large pattern and the fine gate lines array is accomplished at a different stage, with the distance between these two features being dependant on the alignment accuracy from stage to stage. Unfortunately, alignment shifting is an unavoidable factor that must be assessed during the semiconductor manufacturing process. Thus, the distance between these two features may vary according to the shift direction of a stage-to-stage offset. Some large patterns may be closer to the fine gate lines, as desired, and if the distance is shorter to a nominal value requested by the circuit designer, the memory performance may be degraded. A hot carrier, for example, may break down the memory device.

Therefore, the distance between the large pattern (for example, SSL or GSL) and its nearest fine gate line (for example, word line) needs to be a predetermined value as required. And the distance should not be vulnerable to the alignment shift or any process deviation.

SUMMARY OF THE INVENTION

The objective of the present invention is to provide several to embodiments of the present invention.

One embodiment is a semiconductor structure with a gate layer and the gate layer includes a second portion and a first portion having a fine gate line. The second portion has at least one appendage on one side of the second portion. Moreover, the appendage extrudes along the is longitudinal direction of the second portion. The gate line is longitudinally parallel to the second portion and the length of the gate line equals to the longitudinal length of the second portion.

One embodiment is a semiconductor structure with a gate layer and the gate layer includes at least two second portions. Each second portion has at least an appendage on one side of each second portion. Moreover, the appendages extrude along the longitudinal direction of the second portion. The gate layer also has a first portion located between the second portions and is longitudinally parallel to the second portion. The first portion includes plural fine gate lines with the same spacing and are arranged in an array manner. The length of each gate line equals to the longitudinal length of the second portion.

According some embodiments of the present invention. A method of manufacturing a semiconductor structure gate layer can include providing a gate layer, a first cap layer, and a second cap layer, wherein the second cap layer is on the gate layer and the first cap layer is on the second cap layer. A first pattern of the first cap layer can be formed to include a large pitch area and a small pitch area. A spacer can fill into the trenches of the small pitch areas. By using an selective etchant to remove the first cap layer, a plurality of large spacer columns and a plurality of small spacer columns are produced. The method further includes a step to transfer the spacer column pattern in combination with a photoresist pattern to the gate layer in order to produce a second portion gate pattern and a large first portion with a plurality of fine gate lines.

BRIEF DESCRIPTION OF THE DRAWINGS

The invention will be described according to the appended drawings in is which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references. The term "on" implies that the elements may be directly contact or may be above with one or more is intervening elements.

Figure 1:
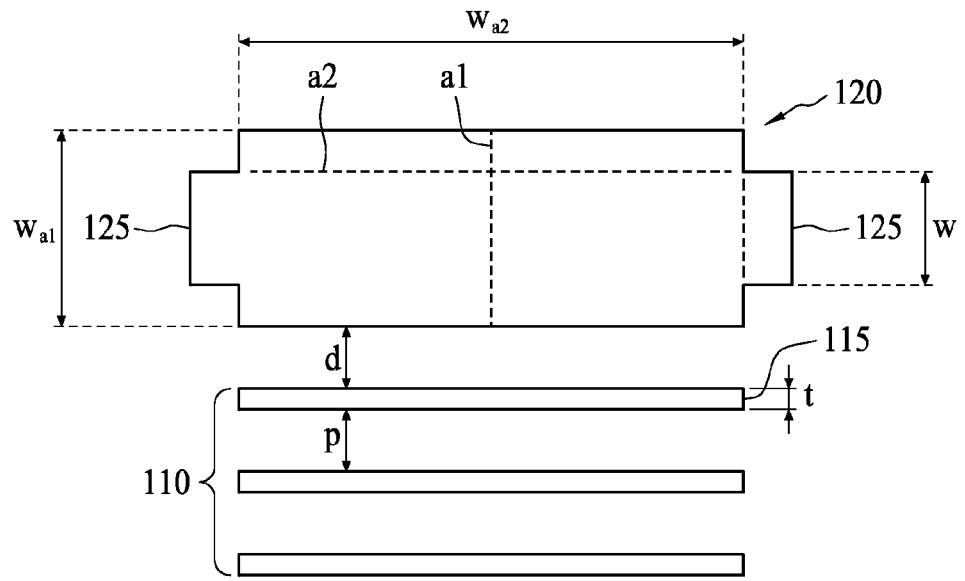
FIG. 1 is a plan view of a semiconductor gate layer pattern according to one embodiment.

FIG. 1 illustrates a semiconductor structure which may be a portion of a semiconductor memory device. The gate layer of the semiconductor structure has a first portion 110. The gate layer also has a second portion 120 which is featured in a larger size and located at a distance d from the first portion 110. The first portion 110 can have a plurality of gate lines 115 that are arranged in an array manner with a spacing p among each other and each gate line may provide a respective control electrode for a non-volatile memory cell. The semiconductor structure can represent a memory area in a semiconductor device. The second portion 120 may be optionally configured as a ground select line (GSL) or a string select line (SSL). There may be more than one first portion 110 in the memory area and each first portion 110 is separated by the second portion 120.

The shape of the second portion 120 is irregular and typically has two major axes, a1 and a2, that are perpendicular to each other. Preferably, axis a1 is shorter than axis a2. The shorter axis a1 is referred to as the width of the second portion 120 in the specification and the longer axis a2 is referred to as the length of the second portion 120. The axial direction of axis a2 is called longitudinal direction in the specification. The second portion 120 further has at least one appendage 125 on one short side (parallel to the short axial a1). In the present embodiment, there are two appendages 125 and each one is located on the opposite short side of the second portion 120. Each appendage 125 has a width W and the appendage 125 extrudes along the longitudinal direction. The gate lines 115 are parallel to the longitudinal direction of the second portion 120 and each gate line 115 has a same width t. The width of the second portion 120 $W_{a1}$ is larger than the gate lines 115 width t and the length of the gate line 115 equals to the length of the second portion 120 $W_{a2}$. The difference between the width of the second portion 120 and the width of the is appendage 125 is also greater than the width of the gate line 115. In one embodiment, the difference between the width of the second portion 120 $W_{a1}$ and the appendage width W is an integral multiple of t i.e. $W_{a1}-W=t, 2t, 3t \ldots$ etc. In another embodiment, the difference between the width of the second portion $W_{a1}$ and the width of the appendage W is two times of the of the gate line width t, i.e. $W_{a1}-W=2t$.

Figure 2:
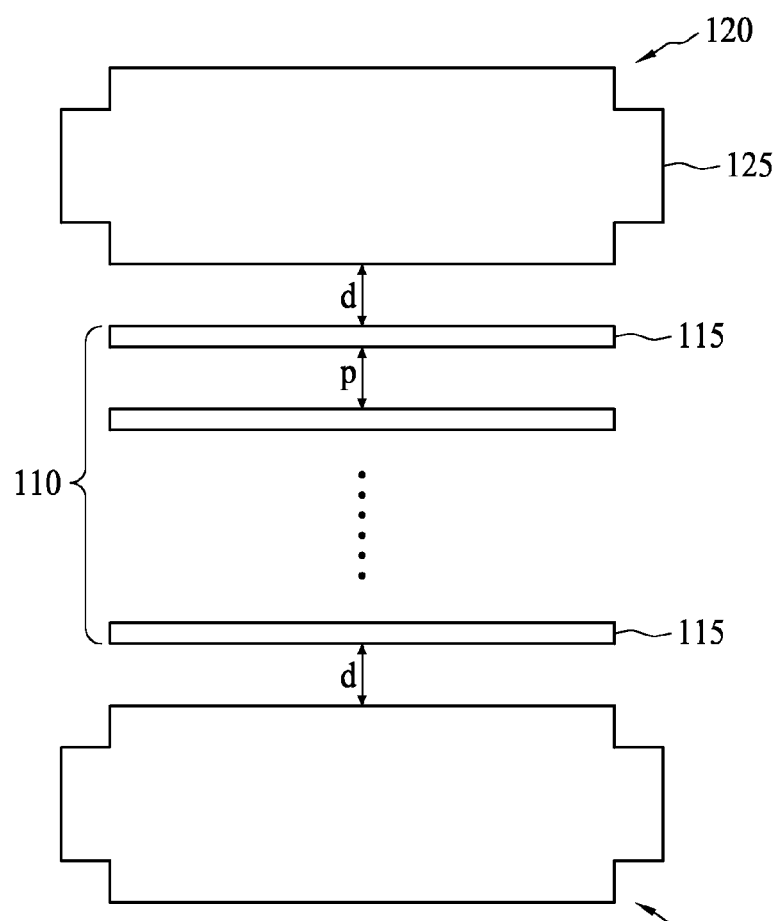
FIG. 2 is a plan view of a semiconductor gate layer pattern according to one embodiment.

FIG. 2 depicts another embodiment according to the present disclosure. Similar to FIG. 1, it also represents a part of a semiconductor memory structure at the gate layer; the difference is that a duplicated second portion 120' is located on the other side of the first portion 110. The array type first portion 110 is between the second portions 120 and 120'. The shape and size of the second portions 120' is identical to the second portion 120. More particularly, each second portion (120 or 120') is located at the same distance d from its nearest gate line 115.

Figure 3A:
FIG. 3A-3I are cross-sectional views illustrating the process to fabricate a semiconductor gate layer pattern according to the present invention.

FIG. 3A-3I illustrate cross-sectional views of various fabricating stages to produce a semiconductor structure as shown in FIG. 2. Referring to FIG. 3A, a gate layer 200 can be formed on a substrate (not shown), such as a silicon substrate. The gate layer 200 may be formed from polysilicon, for example, or amorphous silicon, or any metallic silicide (tungsten, titanium, cobalt etc.). The gate layer is depicted as a single layer but may be a composite structure with several films stacked. A second cap layer 220 may be formed on the gate layer 200. The second cap layer 220 may be a silicon oxide. A first cap layer 210 may be formed on the second cap layer 220 and the first cap layer 210 may be a poly silicon, a silicon nitride, or a silicon oxide. The cap layers can also be called hard masks since they can be used to mask the under layer during an etch.

Figure 3B:
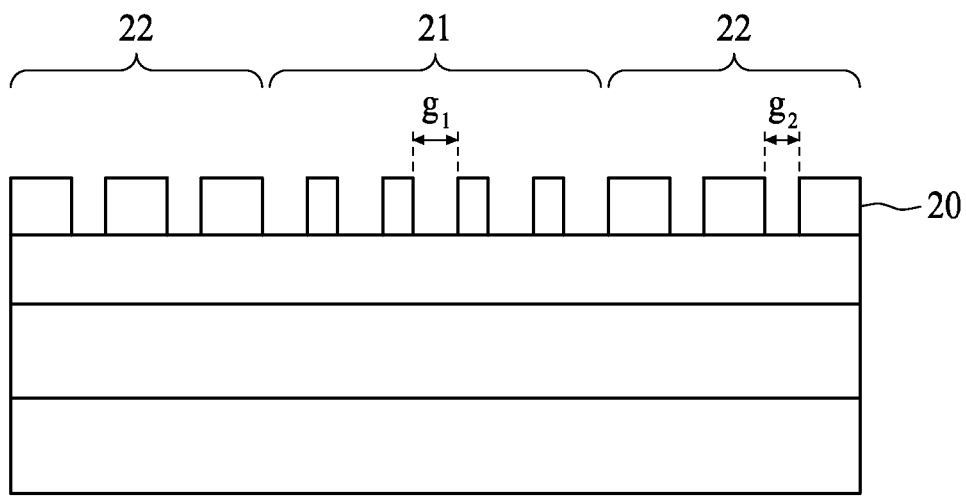

FIG. 3B depicts the semiconductor structure after a photoresist pattern 20 is formed on the first cap layer 210. The photoresist pattern 20 has a large pitch area 21 and at least a small pitch area 22. In the large is pitch area 21, the photoresist width is narrower than the width in the small pitch area 22. The trench width g2 in the small pitch area 22 is predetermined to be greater than the gate line width t, which is shown in FIG. 1 and FIG. 2. In the depicted exemplary embodiment of FIG. 3B, g2 is about two times of the gate line width t. The trench width g1 in the large pitch area 21 is larger than g2 and is preferred to be more than two times of the gate line width t.

Figure 3C:
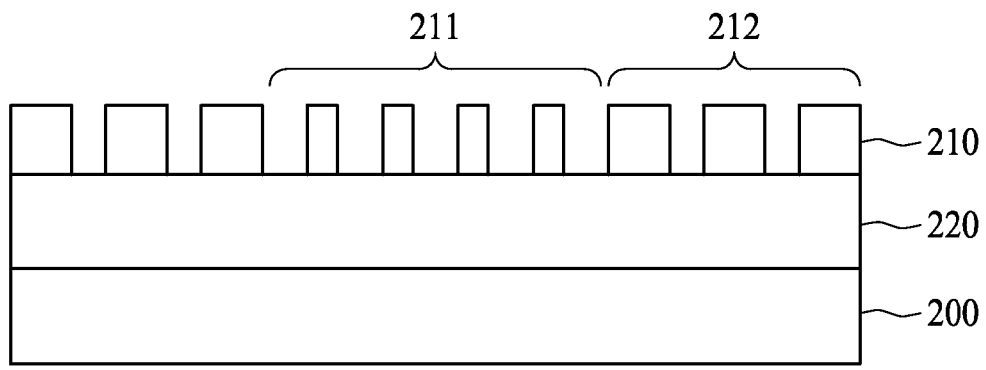

Referring to FIG. 3C, the shapes and features of the photoresist pattern 20 are transferred to the first cap layer 210 by an anisotropic etch process and a photoresist strip process. The first cap layer 210 includes a large pitch area 211 and at least a small pitch area 212 which are distributed and shaped in the same manner as the photoresist pattern 20. The trench width in each area is also the same as defined by the photoresist pattern 20.

Figure 3D:
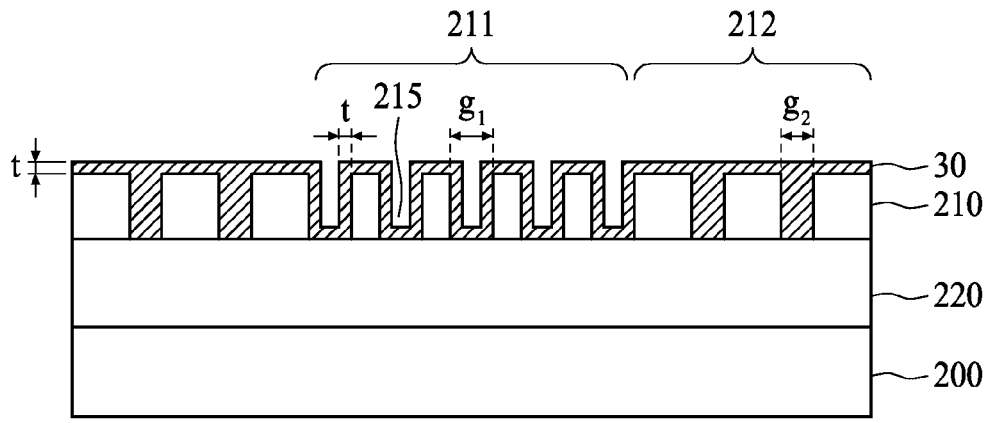

FIG. 3D depicts a spacer 30 with a thickness t (which is also the gate line width) formed on the first cap layer 210. The thickness t is predetermined according to the desired width of the gate line 115, and is preferably equivalent to the gate line width (t) as proposed in FIGS. 1 and 2. Conformity is one of the major factors to select the deposition process for forming the spacer 30. It is desired to have the film formed in accordance with the topography of the first cap layer 210 having the same growth rate at different directions. The growth rate of the spacer 30 at the bottom of the trench should be the same as on the trench sidewall and on the top surface as well. In the embodiments, the small pitch area 212 which has the trench width g2 that is smaller than or equal to two times of the gate line width t, the lateral growth on the trench sidewall may cause the trenches to be filled with a spacer 30. No seam holes should be observed. For the large pitch area 211, since the gap g1 is more than two times larger than the spacer thickness t, the spacer 30 is only formed on the sidewall, top and bottom of the trench. There are a plurality of recesses 215 in the large pitch area 211 after formation of the spacer 30.

Figure 3E:
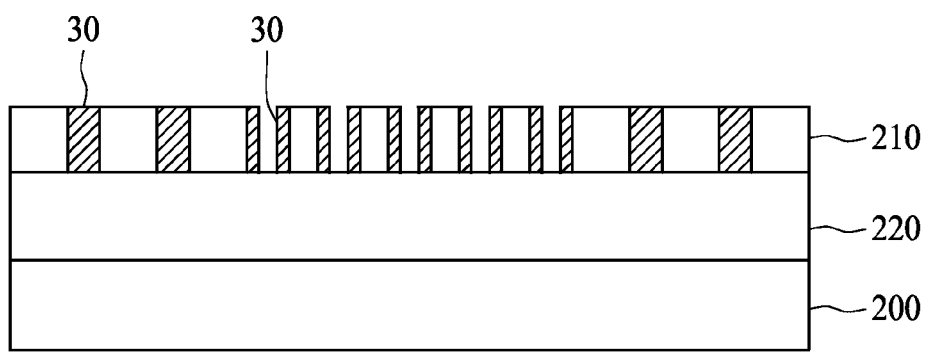

An anisotropic blanket etch process is utilized to remove a portion of the spacer 30 in order to get the structure as shown in FIG. 3E. The to-be-removed thickness of the spacer 30 is preferably to be around t. During the blanket etch, the spacer 30 on the top and bottom (trench bottom only in large pitch area 211) of the trenches is exposed to the plasma etch at the beginning of the process. The etch process is designed to be stopped after the thickness t is removed in order to preserve the spacer 30 on the sidewall, such that the spacers 30 are arranged in accordance with the distribution of the patterned first cap layer 210.

The material for the spacer 30 should have high wet etching selectivity with the first cap layer 210, i.e. the etch rate difference to a selected wet etchant solution between the spacer 30 and the first cap layer needs to be significant. For example, if the first cap layer 210 is made of silicon oxide, then silicon nitride can be selected to form the spacer 30, which may show great differences when the HF (hydrogen per fluoride) is chosen as the wet etch solution.

Figure 3F:
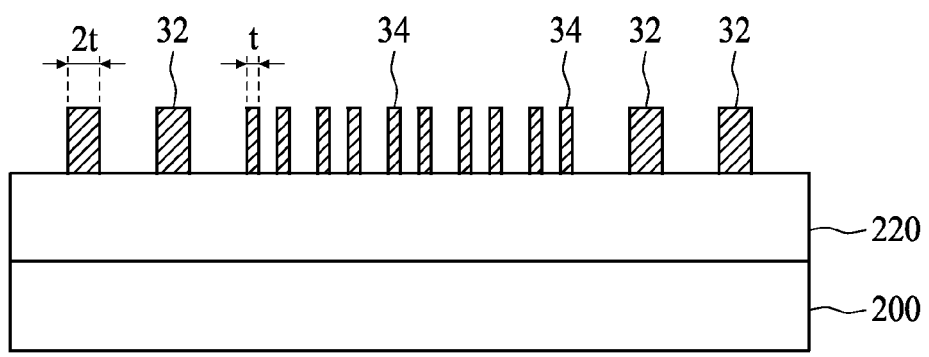

FIG. 3F depicts the semiconductor structure after the selective etch process. The first cap layer 210 is totally removed and a plurality of the spacer columns form on the second cap layer 220. The remaining spacer columns can be categorized into two groups according to their sizes (i.e., the large spacer columns 32 and the small spacer columns 34). The width of the large spacer column 32 is determined by the trench width g2 as shown in FIG. 3B. In the present embodiment, since g2 is two times of the gate line width t, then the width of the large spacer column 32 is 2t. The width of the small spacer column 34 is determined by the thickness of the spacer 30, which is t in the present embodiment.

Figure 3G:
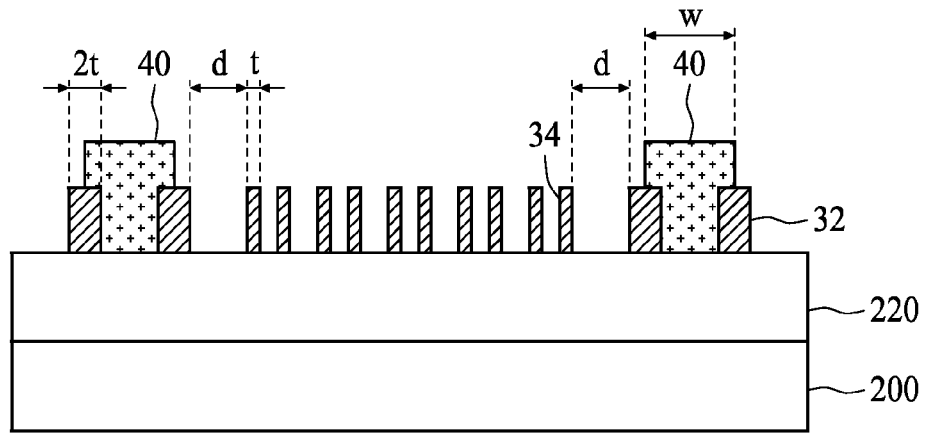
Figure 3H:
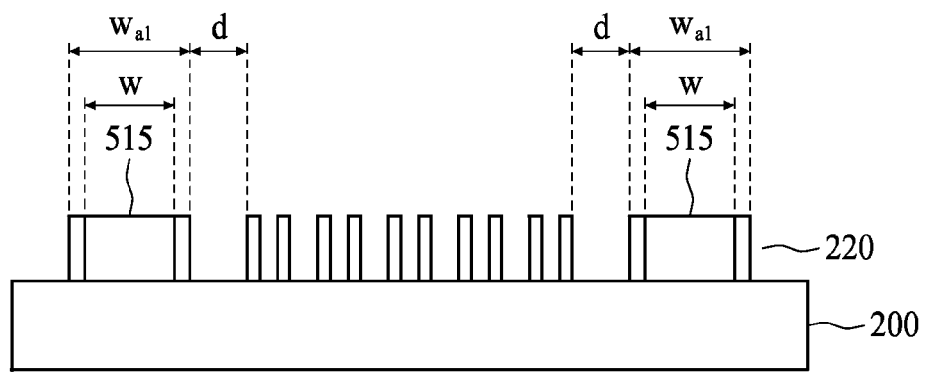

FIG. 3G-3H depicts the stages to prepare an etch mask in order to get the semiconductor structure as shown in FIG. 2. A patterned photoresist 40 is formed on the large spacer columns 32 to increase the masking area. Concurrently, the photoresist 40 is combined with the large spacer columns 32 to provide a broader area coverage to protect the second cap layer 220 underneath from the etch. Positioning the photoresist 40 within the boundary of the large spacer columns 32 is crucial at this stage to precisely control the masking area. The masking area may be changed if the photoresist 40 is not confined within the large spacer columns 32. Typically, the offset of the photoresist 40 alignment is not avoidable due to the limitation of the photo equipment. To locate the photoresist 40 right at the center of the trench between the large spacer columns 32 may not be easy to achieve. In the present embodiment, with the wider large spacer columns 32, the tolerance of the shift can be allowed is increased from t to 2t in comparison with the conventional process. For the technology capability to fabricate a gate with a gate line width t, it is not difficult to control the alignment offset within 2t. Thus, the masking area is controlled precisely such that the distance d between the large spacer columns 32 and its nearest small spacer column 34 is fixed.

Figure 4:
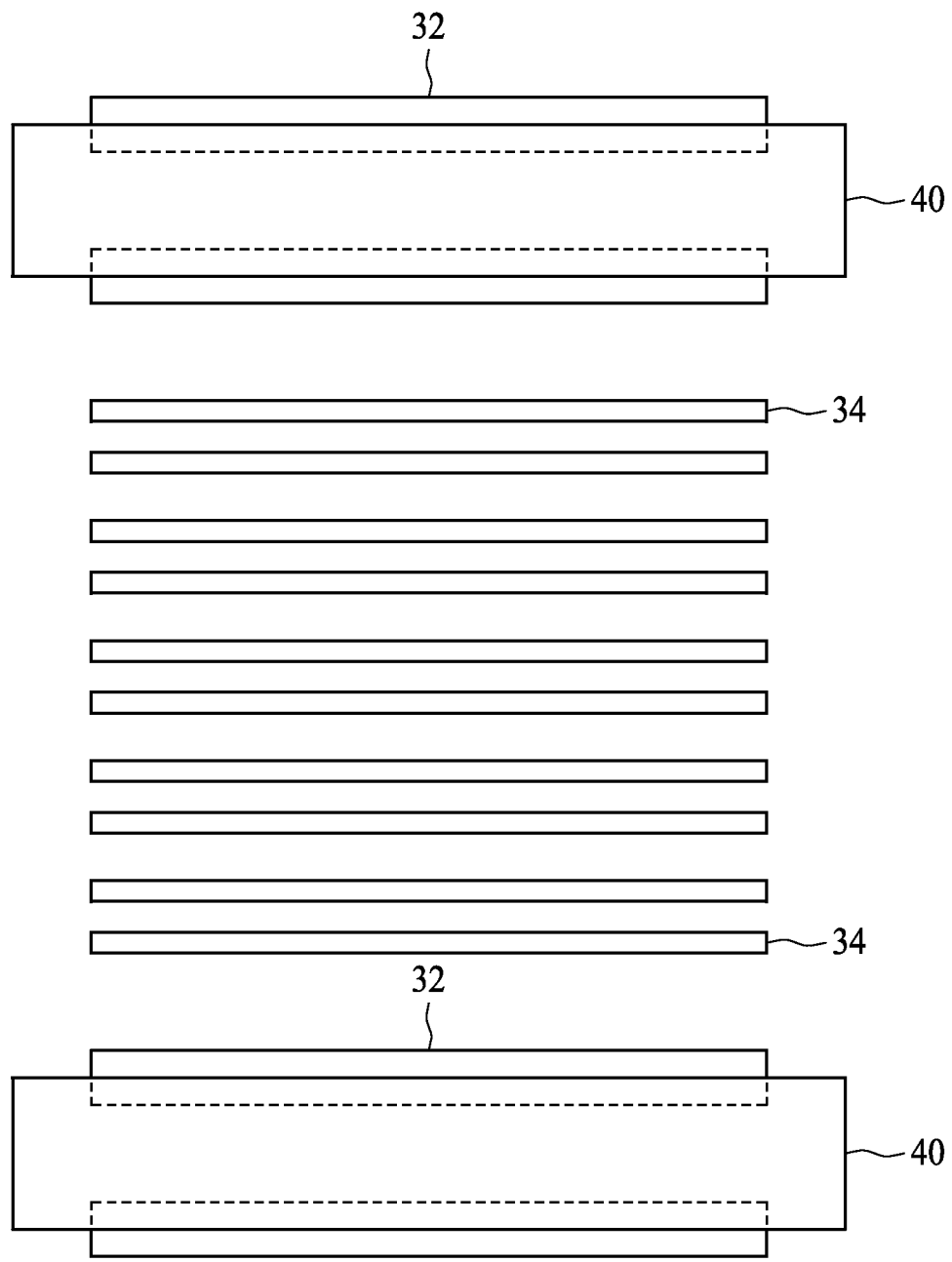
FIG. 4 is a plan view of the embodiment shown in FIG. 3G.

The top view of the shapes and features of the spacer columns in concurrency with the photoresist pattern 40 is shown in FIG. 4. Preferably, the photoresist 40 has a larger length than the wide spacer columns 32. The shapes and features are transferred to the second cap layer 220 by an anisotropic etch process as illustrated in FIG. 3H.

Figure 5:
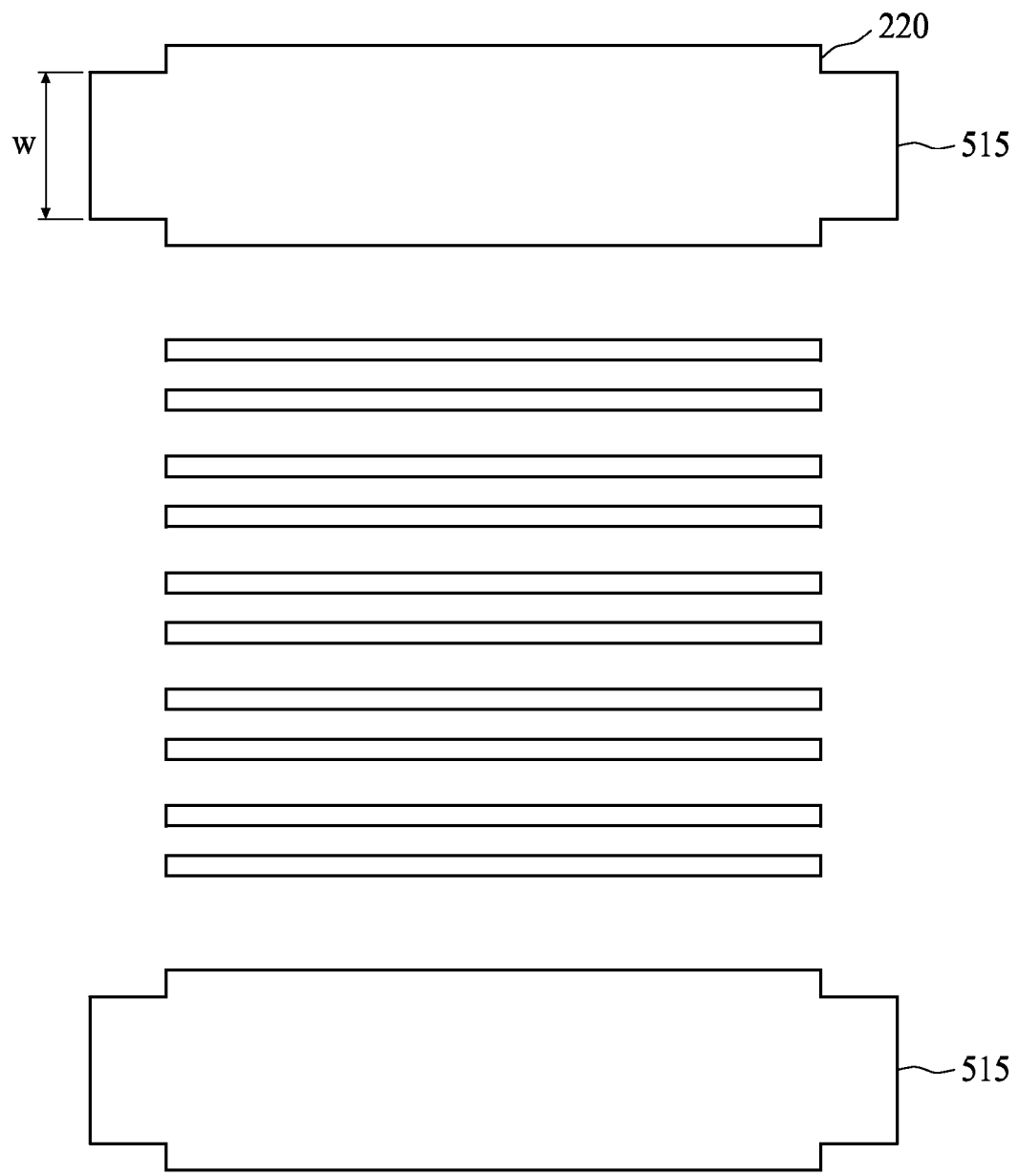
FIG. 5 is a plan view of the embodiment shown in FIG. 3H.

A portion of the second cap layer 220 is carved out to prepare an etch hard mask for the gate layer 200. To be noted here, by combining the photoresist 40 and the large spacer 32, a larger width $W_{a1}$ is transferred to the second cap layer 220, and moreover, at least one appendage 515 is formed as shown in FIG. 5. The appendage width W is the width of the photoresist 40.

Figure 3I:
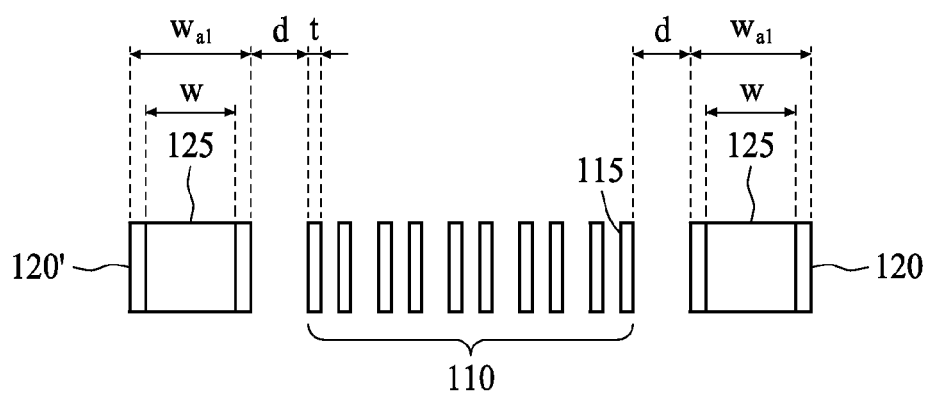

FIG. 3I depicts the step transferring the second cap layer 220 pattern to the gate layer 200 by an anisotropic etch process. FIG. 2 is the top view of the defined gate layer pattern, wherein the first portion 110 has a is plurality of fine gate lines 115 and the second portions 120 and 120' have at least two large gate patterns.

Thus, as described above, even though the alignment shift during the pattern transfer process is avoided, the distance d from the second portion 120 to the gate line 115 is fixed without deviation because the doubled spacer width can tolerate the offset.

The methods and features of this invention have been sufficiently described in the above examples and descriptions. It should be understood that any modifications or changes without departing from the spirit of the invention are intended to be covered in the protection scope of the invention.

What is claimed is:

1. A semiconductor structure with a gate layer, the gate layer comprising:
    a first portion comprising a plurality of gate lines with a same spacing and arranged in an array manner, and each of said gate lines extending for a first length in a longitudinal direction normal to a depth of the gate layer; and
    at least two second portions, each comprising:
        a main rectangular portion, with:
            a length dimension, extending in said longitudinal direction for said first length; and
            a first width dimension, normal to said depth and perpendicular to said longitudinal direction; and
        a rectangular appendage, with a second width dimension less than said first width dimension, said rectangular appendage extending from said main rectangular portion along said longitudinal direction,
    wherein each of the second portions has an identical shape and size, a main top surface of the main rectangular portion is disposed at the same level as an appendage top surface of the rectangular appendage, and a main bottom surface of the main rectangular portion is disposed at the same level as an appendage bottom surface of the rectangular appendage.

2. The semiconductor structure according to claim 1, wherein the distance from each second portion to its corresponding nearest gate line is the same.

3. The semiconductor structure according to claim 1, wherein each second portion comprises two rectangular appendages, and the rectangular appendages are separately located on opposite side of the second portion and extruding along the longitudinal direction.

4. The semiconductor structure according to claim 1, wherein the first width dimension of the second portions is greater than a width dimension of the gate line.

5. The semiconductor structure according to claim 1, wherein the difference between the first width dimension and the second width dimension is an integral multiple of the width dimension of the gate line.

6. The semiconductor structure according to claim 1, wherein one of the second portions is a GSL or a SSL.

\* \* \* \* \*